(12) United States Patent
Sommers et al.

(10) Patent No.: US 8,372,211 B2
(45) Date of Patent: Feb. 12, 2013

(54) METHOD AND APPARATUS FOR SHOWERHEAD CLEANING

(75) Inventors: Joseph F. Sommers, San Jose, CA (US); Jiansheng Wang, Union City, CA (US); David Do, Milpitas, CA (US); Satyanarayana Adamala, Fremont, CA (US); Ronald Trahan, Beverton, OR (US)

(73) Assignee: Quantum Global Technologies, LLC, Dublin, PA (US)

( * ) Notice: Subject to any disclaimer, the term of this patent is extended or adjusted under 35 U.S.C. 154(b) by 262 days.

(21) Appl. No.: 12/881,503

(22) Filed: Sep. 14, 2010

(65) Prior Publication Data

US 2011/0061685 A1 Mar. 17, 2011

Related U.S. Application Data

(60) Provisional application No. 61/242,738, filed on Sep. 15, 2009.

(51) Int. Cl.
B08B 7/04 (2006.01)
B08B 3/04 (2006.01)
B08B 3/10 (2006.01)

(52) U.S. Cl. .................. 134/26; 134/1; 134/10; 134/34; 134/36

(58) Field of Classification Search .................. None
See application file for complete search history.

(56) References Cited

U.S. PATENT DOCUMENTS

| 4,778,532 A | 10/1988 | McConnell et al. |
| 6,431,959 B1 | 8/2002 | Mikhaylich et al. |
| 2003/0221744 A1 | 12/2003 | Hu et al. |
| 2008/0142055 A1 | 6/2008 | Yin et al. |

FOREIGN PATENT DOCUMENTS

| EP | 1550516 | 7/2005 |
| EP | 1550516 A1 * | 7/2005 |
| JP | 05-217988 | 8/1993 |
| JP | 2009136754 A * | 6/2009 |

OTHER PUBLICATIONS

English Machine Translation of JP 2009-136754 A.*
International Search Report and Written Opinion of the International Searching Authority mailed Apr. 21, 2011 in PCT/US2010/048732 (APPM/014726PCT).

* cited by examiner

*Primary Examiner* — Michael Kornakov
*Assistant Examiner* — Nicole Blan
(74) *Attorney, Agent, or Firm* — Fox Rothschild, LLP

(57) ABSTRACT

Embodiments of the present invention generally relate to a method and apparatus for ex-situ cleaning of a chamber component part. In one embodiment, a system for cleaning component parts in a cleaning chemistry is provided. The system comprises a wet bench set-up comprising a cleaning vessel assembly for holding one or more component parts to be cleaned during a cleaning process and a detachable cleaning cart detachably coupled with the cleaning vessel assembly for supplying one or more cleaning chemistries to the cleaning vessel assembly during the cleaning process.

5 Claims, 4 Drawing Sheets

METHOD AND APPARATUS FOR SHOWERHEAD CLEANING

CROSS-REFERENCE TO RELATED APPLICATIONS

This application claims benefit of U.S. provisional patent application Ser. No. 61/242,738, filed Sep. 15, 2009, which is herein incorporated by reference in its entirety.

BACKGROUND OF THE INVENTION

1. Field of the Invention

Embodiments of the present invention generally relate to a method and apparatus for ex-situ cleaning of a chamber component. More particularly, embodiments of the present invention generally relate to a method and apparatus for ex-situ cleaning of a chamber component used in a semiconductor processing chamber.

2. Description of the Related Art

Plasma processing of semiconductor wafers in the manufacture of microelectronic integrated circuits is used in dielectric etching, metal etching, chemical vapor deposition and other processes. In semiconductor substrate processing, the trend towards increasingly smaller feature sizes and linewidths has placed a premium on the ability to mask, etch, and deposit material on a semiconductor substrate, with greater precision.

Typically, etching is accomplished by applying radio frequency (RF) power to a working gas supplied to a low pressure processing region over a substrate supported by a support member. The resulting electric field creates a reaction zone in the processing region that excites the working gas into a plasma. The support member is biased to attract ions within the plasma towards the substrate supported thereon. Ions migrate towards a boundary layer of the plasma adjacent to the substrate and accelerate upon leaving the boundary layer. The accelerated ions produce the energy required to remove, or etch, the material from the surface of the substrate. As the accelerated ions can etch other components within the processing chamber, it is important that the plasma be confined to the processing region above the substrate. The etch gas is typically directed through a showerhead situated near the top of the chamber. Fluorine-based chemistries are generally used during etching processes.

However, the use of fluorine, while advantageous for the etching process, reacts to form deposits in the narrow channels of the showerhead and on other surfaces that are made of aluminum, a material commonly used in etch chambers. The aluminum fluoride deposits formed in this manner have a generally rough surface topography. The rough surface of the aluminum fluoride deposits often blocks the channels of the showerhead. Additionally, the aluminum fluoride deposits within the gas channels become a source of particulate contamination. Current cleaning methods either fail to adequately clean the deposits on the showerhead or require significant system downtime, further resulting in increased overall production costs.

Therefore, there is a need for an improved apparatus and process for cleaning chamber components such as showerheads that provide significantly less downtime for chamber maintenance and cleaning.

SUMMARY OF THE INVENTION

Embodiments of the present invention generally relate to a method and apparatus for ex-situ cleaning of a chamber component part. In one embodiment, a system for cleaning component parts in a cleaning chemistry is provided. The system comprises a wet bench set-up comprising a cleaning vessel assembly for holding one or more component parts to be cleaned during a cleaning process and a detachable cleaning cart detachably coupled with the cleaning vessel assembly for supplying one or more cleaning chemistries to the cleaning vessel assembly during the cleaning process.

In another embodiment, a system for cleaning component parts in a cleaning chemistry is provided. The system comprises a wet bench set-up and a detachable cleaning cart. The wet bench set-up comprises a cleaning vessel assembly for holding one or more component parts to be cleaned during a cleaning process, comprising an outer cleaning basin, a first cleaning basin circumscribed by the outer cleaning basin, and a second cleaning basin circumscribed by the outer cleaning basin. The detachable cleaning cart is detachably coupled with the cleaning vessel assembly for supplying one or more cleaning chemistries to the cleaning vessel assembly during the cleaning process.

In yet another embodiment, a method for cleaning component parts in a cleaning chemistry is provided. The method comprises providing a cleaning vessel assembly for holding one or more component parts to be cleaned during a cleaning process and providing a detachable cleaning cart detachably coupled with the cleaning vessel for supplying one or more cleaning chemistries to the cleaning vessel assembly during the cleaning process. The cleaning vessel assembly comprises an outer cleaning basin, a first cleaning basin circumscribed by the outer cleaning basin, a second cleaning basin circumscribed by the outer cleaning basin, and a transducer positioned within the outer cleaning basin below the first cleaning basin and the second cleaning basin. The detachable cleaning cart comprises an inert gas module for supplying an inert gas, such as nitrogen ($N_2$) which may be used as a purge gas during the cleaning process, a deionized (DI) water supply module for supplying deionized water during the cleaning process, a first cleaning fluid supply tank for supplying a first cleaning fluid to the first cleaning basin, and a second cleaning fluid supply tank for supplying a second cleaning fluid to the second cleaning basin. A first component part is positioned in the first cleaning basin. A second component part is positioned in the second cleaning basin. A first cleaning fluid is flowed from the first cleaning fluid supply tank into the first cleaning basin. A second cleaning fluid is flowed from the second cleaning fluid supply tank into the second cleaning basin. The transducer is cycled on and off to agitate the first cleaning fluid and the second cleaning fluid to clean the component parts and DI water is flowed from the DI water supply module into the first cleaning basin and the second cleaning basin to purge the first cleaning fluid from the first cleaning basin and the second cleaning fluid from the second cleaning basin.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Embodiments described herein generally relate to a method and apparatus for ex-situ cleaning of chamber component parts.

Figure 1:
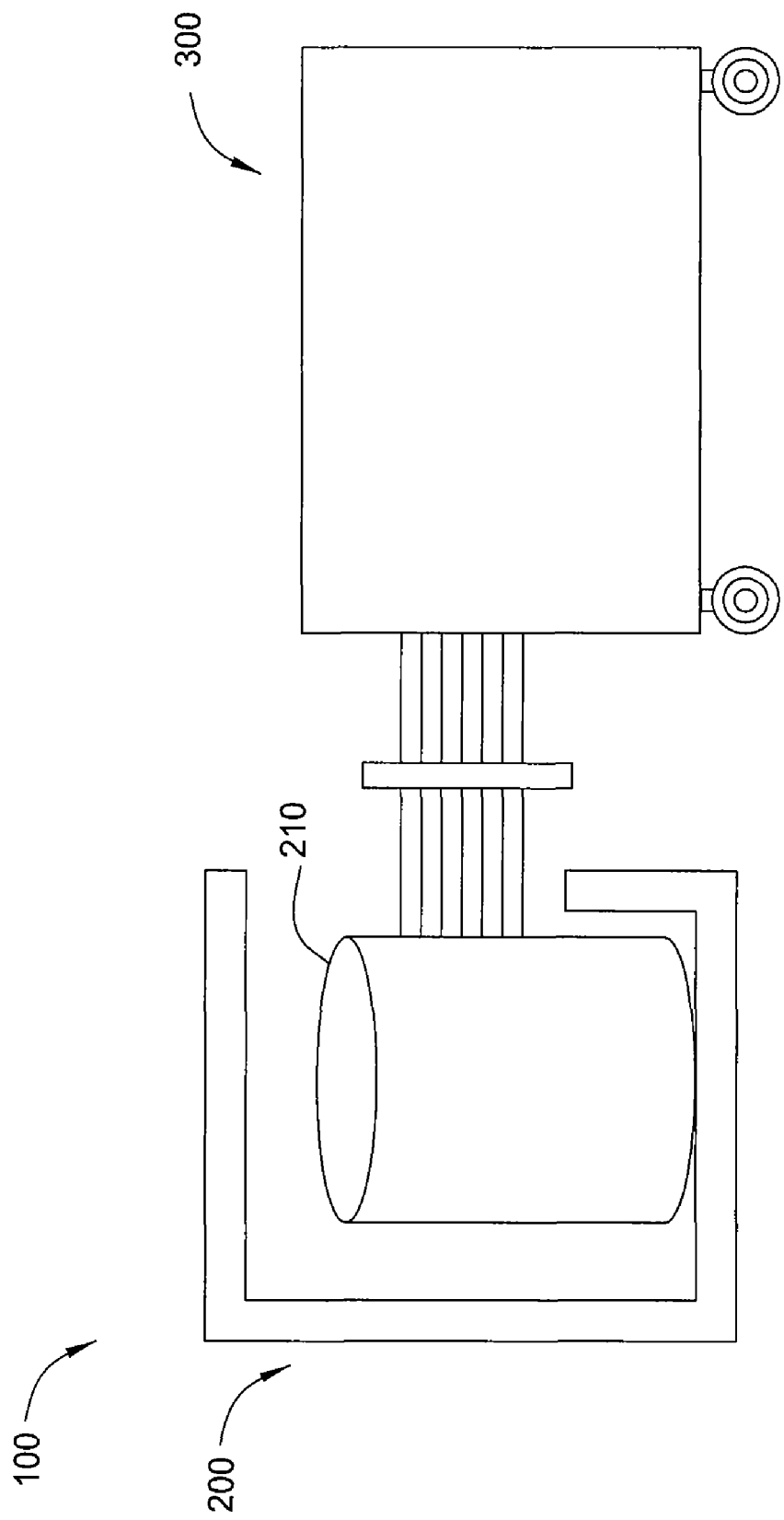
FIG. 1 is a schematic side view of one embodiment of a cleaning system according to embodiments described herein.

FIG. 1 is a schematic side view of a cleaning system 100 for ex-situ cleaning of chamber component parts according to embodiments described herein. In one embodiment, the one or more chamber component parts are used in a semiconductor processing chamber. In one embodiment, the chamber component parts comprise one or more showerheads. The chamber component parts may comprise a silicon carbide faceplate and an aluminum base. In one embodiment, the chamber component part comprises copper. In one embodiment, the cleaning system 100 comprises a wet bench set-up 200 which comprises a cleaning vessel assembly 210 for holding the component parts to be cleaned during the cleaning process and a detachable cleaning cart 300 detachably coupled with the wet bench set-up for supplying the selected cleaning chemistry to the cleaning vessel assembly 210 during the cleaning process. The detachable cleaning cart 300 is movable and may be detachably coupled with the cleaning vessel assembly 210 prior to and during the cleaning process and may be removed from the cleaning vessel assembly 210 when cleaning is not taking place. Thus the detachable cleaning cart 300 may be used to service different cleaning vessels at different locations. Both the detachable cleaning cart 300 and the wet bench set-up 200 are described in further detail with reference to FIG. 2 and FIG. 3.

Figure 2:
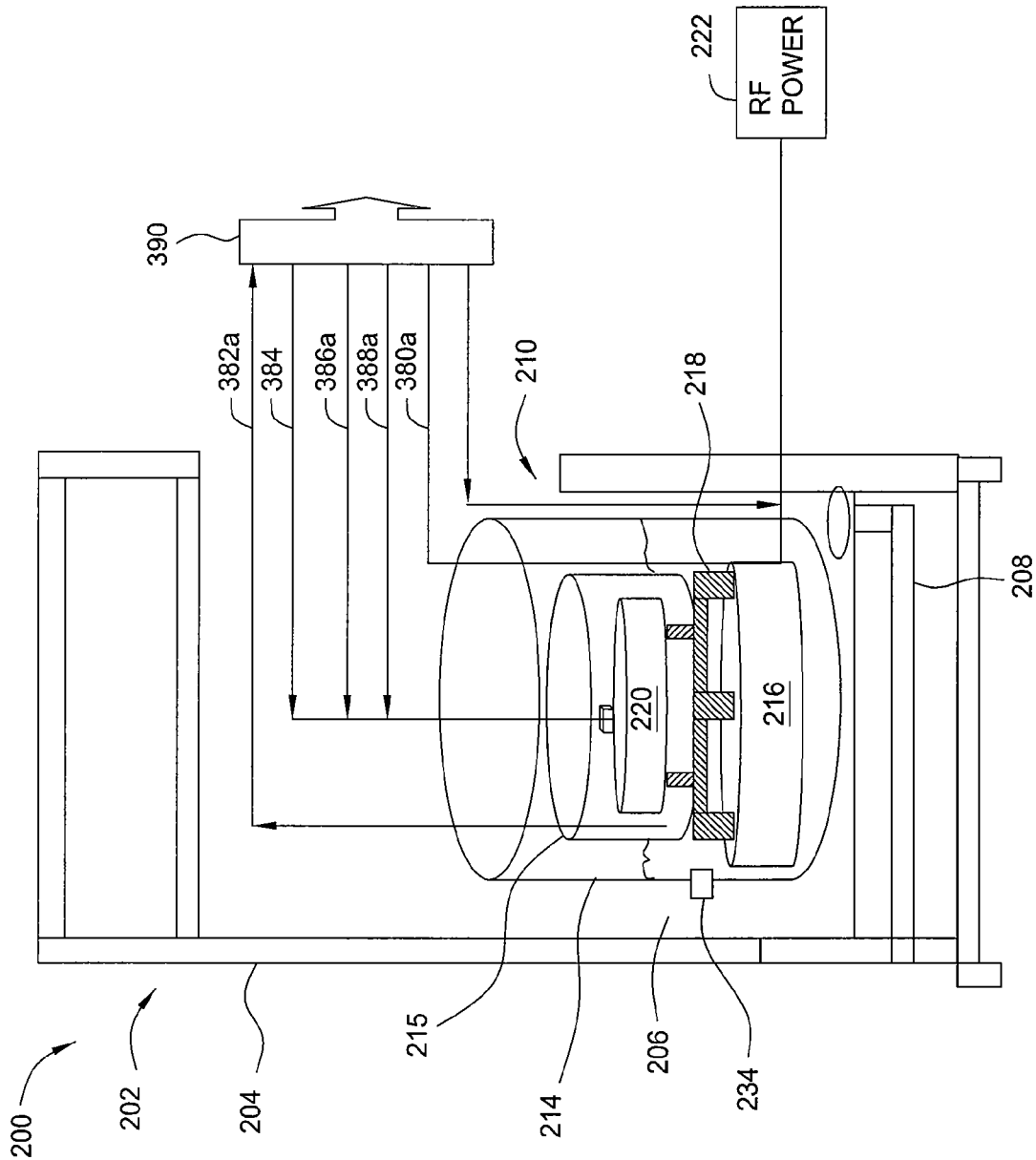
FIG. 2 is a schematic side view of one embodiment of a wet bench set-up according to embodiments described herein.

FIG. 2 is a schematic side view of one embodiment of the wet bench set-up 200 according to embodiments described herein. The wet bench set-up 200 comprises a wet bench 202 and the cleaning vessel assembly 210. The wet bench 202 provides support for the cleaning vessel assembly 210. The wet bench 202 may also serve as an overflow basin for any cleaning chemicals which overflow the cleaning vessel assembly 210. The wet bench 202 may also function as a fume hood when used in cleaning processes which generate gases and/or particulates. Although shown with the wet bench 202, in certain embodiments, the cleaning vessel assembly 210 is used in a stand alone fashion without the wet bench 202. For example, in well ventilated areas where there is less concern about the buildup of fumes.

The wet bench 202 comprises a frame 204 which forms an overflow basin 206 for both holding the cleaning vessel assembly 210 and capturing any fluids which may overflow the cleaning vessel assembly 210 during processing. The overflow basin 206 is fluidly coupled with a sink drain line 208 for removing any fluids captured by the overflow basin 206 during cleaning.

The cleaning vessel assembly 210 comprises an outer cleaning basin 214 which circumscribes a cleaning basin 215 that holds the component part to be cleaned, a transducer 216 positioned within the outer cleaning basin 214, and a support 218 positioned within the outer cleaning basin 214 for supporting the cleaning basin 215.

Although shown as cylindrical in FIG. 2, it should be understood that the outer cleaning basin 214 and/or the cleaning basin 215 may be any shape, for example, square or rectangular. In one embodiment, the outer cleaning basin 214 and/or the cleaning basin 215 may comprise a material such as polyvinyl difluoride (PVDF) or any other materials compatible with process and cleaning chemistries.

The transducer 216 is configured to provide either ultrasonic or megasonic energy to the cleaning region where the component part 220 is positioned in the cleaning basin 215. The transducer 216 may be implemented, for example, using piezoelectric actuators, or any other suitable mechanism that can generate vibrations at ultrasonic or megasonic frequencies of desired amplitude. The transducer 216 may comprise a single transducer, as shown in FIG. 2, or an array of multiple transducers, oriented to direct ultrasonic energy into the cleaning region where the component part is positioned. When the transducer 216 directs energy into the cleaning fluid in the cleaning basin 215, acoustic streaming, i.e. streams of micro bubbles, within the cleaning fluid may be induced. The acoustic streaming aids the removal of contaminants from the component part 220 being processed and keeps the removed particles in motion within the cleaning fluid hence avoiding reattachment of the of the removed particles to the component part surface. The transducer 216 may be configured to direct ultrasonic or megasonic energy in a direction normal to the edge of the component part 220 or at an angle from normal. In one embodiment, the transducer 216 is dimensioned to be approximately equal in length to the diameter of the component part 220 to be cleaned. The transducer 216 may be coupled to an RF power supply 222.

While only one transducer 216 is shown, multiple transducers may be used with certain embodiments. For example, additional transducers may be placed in a vertical orientation along the side of the component part 220 to direct ultrasonic or megasonic energy toward the component part 220 from the side. The transducer 216 may be positioned outside of the outer cleaning basin 214. In one embodiment, the transducer 216 may be positioned in the overflow basin 206 to direct ultrasonic or megasonic energy toward the component part 220. Although the transducer 216 is shown as cylindrical, it should be understood that transducers of any shape may be used with the embodiments described herein.

The wet bench set-up 200 also comprises one or more fluid delivery lines 382a, 384, 386a, and 388a for delivering cleaning fluids to the wet bench set-up and returning used cleaning fluids to the detachable cleaning cart 300 for recycling and reuse. The fluid delivery lines are configured to mate with corresponding fluid delivery lines 382b, 386b, and 388b on the detachable cleaning cart 300 using, for example, connect fittings and disconnect couplings shown as a "Quick Connect" 390.

Figure 3:
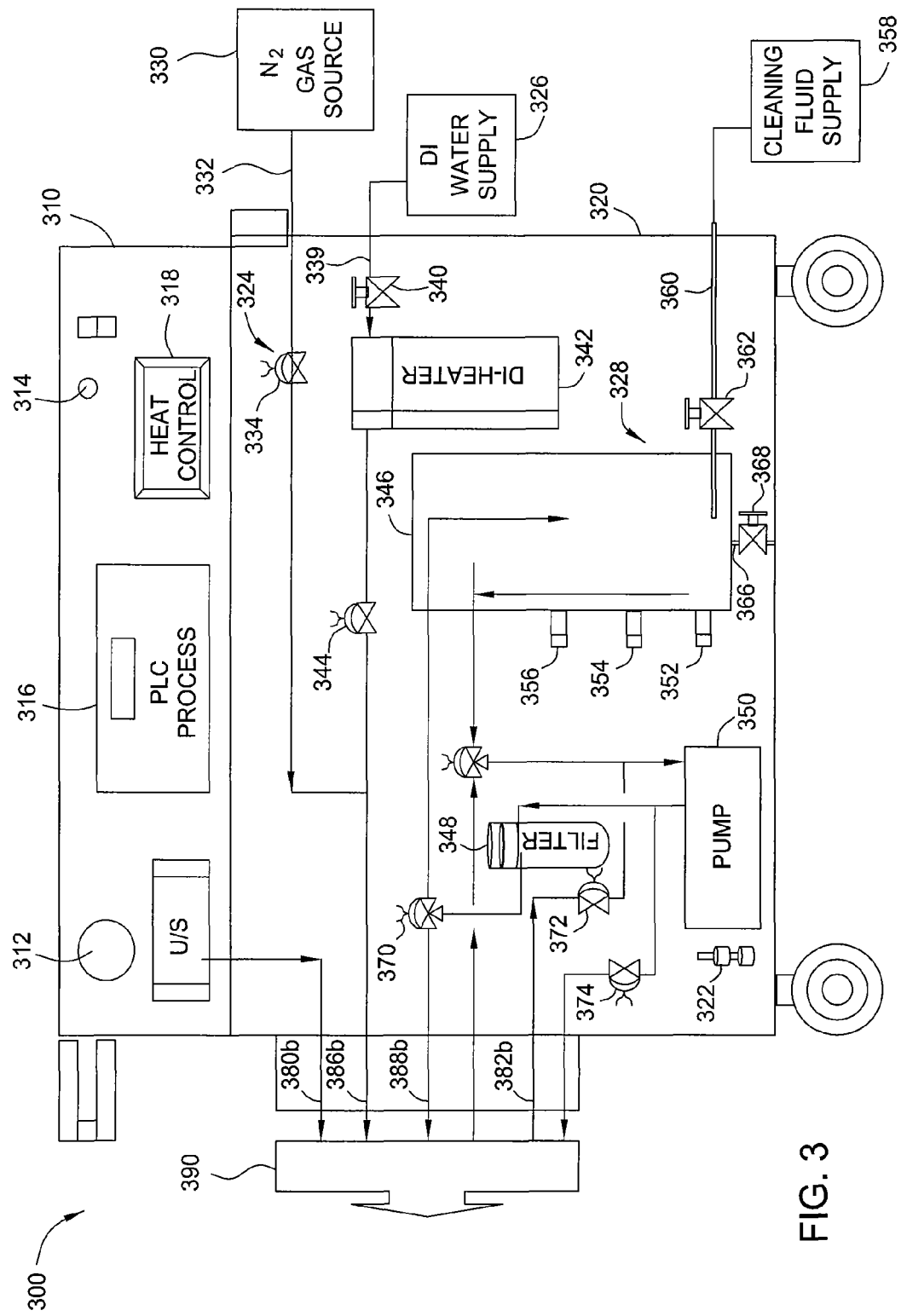
FIG. 3 is a schematic side view of one embodiment of a detachable cleaning cart according to embodiments described herein.

FIG. 3 is a schematic side view of a detachable cleaning cart 300 showing a fluid flow circuit schematic diagram according to embodiments described herein. In one embodiment, the detachable cleaning cart 300 comprises a system controller 310 for controlling the cleaning process and a cleaning fluid supply module 320 for supplying and recycling cleaning fluid. In one embodiment, the system controller 310 is separate from the detachable cleaning cart 300.

In general, the system controller 310 may be used to control one or more controller components found in the cleaning system 100. The system controller 310 is generally designed to facilitate the control and automation of the overall cleaning system 100 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, processing temperature, I/O signals, transducer power etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 310 determines which tasks are performable on a substrate. Preferably, the program is software readable by the system controller 310 that includes code to perform tasks relating to monitoring, execution and control of the movement, support, and/or positioning of a substrate along with the various process recipe tasks and various chamber process recipe steps being performed in the cleaning system 100. In one embodiment, the system controller 310 also contains a plurality of programmable logic controllers (PLC's) that are used to locally control one or more modules in the cleaning system 100.

In one embodiment, the system controller 310 comprises controller components selected from at least one of the following: a PhotoMeghelic meter 312, a leak alarm 314 for detecting leaks within the detachable cleaning cart, a programmable logic controller 316 for controlling the overall cleaning system 100, and an in-line heat controller 318. In one embodiment, the leak alarm 314 is electronically coupled with the carts plenum leak sensor for detecting the presence of fluid in the bottom of the cart 300. In one embodiment, the system controller 310 is coupled with the transducer 216 via communication line 380 and controls the power supplied to the transducer 216.

In one embodiment, the cleaning fluid supply module 320 comprises an inert gas module 324 for supplying an inert gas, such as nitrogen ($N_2$) which may be used as a purge gas during the cleaning process, a DI water supply module 326 for supplying deionized water during the cleaning process, and a cleaning fluid supply module 328 for supplying cleaning fluid and recycling used cleaning fluid.

With regard to the inert gas module 324, as discussed above, the use of nitrogen is exemplary and any suitable carrier gas/purge gas may be used with the present system. In one embodiment, the inert gas is supplied from a nitrogen gas source 330 to a main nitrogen gas supply line 332. In one embodiment, the nitrogen gas source comprises a facility nitrogen supply. In one embodiment, the nitrogen source may be a portable source coupled with the detachable cleaning cart 300. In one embodiment, the nitrogen supply line 332 comprises a manual shutoff valve (not shown) and a filter (not shown) for filtering contaminants from the nitrogen gas. A two-way valve 334 which may be an air operated valve is also coupled with the nitrogen supply line 332. When the two-way valve is open, nitrogen gas flows through the supply line 324 and into the outer cleaning basin 214. Nitrogen may be used in several different applications within the cleaning system. For example, the first nitrogen line 336 supplies nitrogen, which is used to flow heated nitrogen over the liquid IPA during the vapor generation phase, to the first IPA vapor generator. The nitrogen supply line 332 may also contain additional valves, pressure regulators, pressure transducers, and pressure indicators which are not described in detail for the sake of brevity. In one embodiment, nitrogen gas may be supplied to the outer cleaning basin 214 via fluid supply line 384.

With regard to the DI water supply module 326, the use of DI water is exemplary and any fluid suitable for cleaning may be used with the present cleaning system 100. In one embodiment, the DI water is supplied from a DI water supply module 326 to a main DI water supply line 339. In one embodiment, the DI water source comprises a facility DI supply. In one embodiment, the DI water source may be a portable source coupled with the detachable cleaning cart 300. In one embodiment, the DI water supply line 339 comprises a manual shutoff valve 340 and a heater 342 for heating the DI water to a desired temperature for assisting in the cleaning process. The heater 342 may be in electronic communication with the heat controller 318 for controlling the temperature. The DI water supply line 339 further comprises a two-way valve 344 which may be an air operated valve which is used for controlling the flow of DI water into the outer cleaning basin 214. When the two-way valve 344 is open, DI water flows into the outer cleaning basin 214. When the two-way valve 344 is closed and two-way valve 334 is open, nitrogen purge gas flows into the outer cleaning basin 214. The DI water supply line 339 may also contain additional valves, pressure regulators, pressure transducers, and pressure indicators which are not described in detail for the sake of brevity. In one embodiment, DI water may flow into the outer cleaning basin 214 via supply line 386.

The cleaning fluid supply module 328 comprises a cleaning fluid supply tank 346 for storing cleaning fluid, a filter system 348 for filtering used cleaning fluid, and a pump system 350 for pumping cleaning fluid into and out of the cleaning fluid supply module 328. The cleaning fluid may comprise deionized water (DIW), one or more solvents, a cleaning chemistry such as standard clean 1 (SC1), selective deposition removal reagent (SDR), surfactants, acids, bases, or any other chemical useful for removing contaminants and/or particulates from a component part.

In one embodiment, the cleaning fluid supply tank 346 is coupled with a cleaning fluid supply 358 via a supply line 360. In one embodiment, the cleaning fluid supply line 360 comprises a manual shut-off valve 362 for controlling the flow of cleaning fluid into the cleaning fluid supply tank 346. The cleaning fluid supply line 360 may also contain additional valves, pressure regulators, pressure transducers, and pressure indicators which are not described in detail for the sake of brevity. In one embodiment, the cleaning fluid supply tank 346 is coupled with the outer cleaning basin 214 via supply line 388.

In one embodiment, the cleaning fluid supply tank 346 is coupled with a cleaning fluid supply drain 366 for removing cleaning fluid from the cleaning fluid supply tank 346. The flow of cleaning fluid through the cleaning fluid supply drain 366 is controlled by a manual shut-off valve 368.

The cleaning fluid supply tank 346 may also include a plurality of fluid level sensors for detecting the level of processing fluid within the cleaning fluid supply tank 346. In one embodiment, the plurality of fluid sensors may include a first fluid sensor 352 which indicates when the fluid supply is low and that the pump system 350 should be turned off. When the level of cleaning fluid is low, the first fluid level sensor 352 may be used in a feedback loop to signal the cleaning fluid supply 358 to deliver more cleaning fluid to the cleaning fluid supply tank 346. A second fluid level sensor 354 which indicates that the cleaning fluid supply tank 346 is full and the pump 350 should be turned on. A third fluid sensor 356 which indicates that the cleaning fluid supply tank 346 has been overfilled and that the pump 350 should be turned off. Although one fluid level sensor 234 is shown in the embodiment of FIG. 2, any number of fluid level sensors 234 may be included on the outer cleaning basin 214.

Used cleaning fluid may be returned from the outer cleaning basin 214 to the filter system 348 where particulates and other contaminants may be removed from the used cleaning fluid to produce renewed cleaning fluid. In one embodiment, used cleaning fluid may be returned from the overflow basin via fluid recycling line 382. The recycling line 382 may also contain additional valves, pressure regulators, pressure transducers, and pressure indicators which are not described in detail for the sake of brevity. After filtration, the renewed cleaning fluid may be recirculated back to the cleaning fluid supply tank 346 via a three-way valve 370. In one embodiment, the three-way valve 370 may also be used in conjunction with the pump system 350 to recirculate fluid through the cleaning system to flush the cleaning system 100. In one embodiment, a two-way valve 372 which may be an air operated valve may be used to suck DI water through the input of the pump system 350. In one embodiment, a two-way valve 374 may be used to pump out DI water to drain.

In one embodiment, a component part 220 is placed on the support 218 positioned within the cleaning basin 215. A cleaning cycle is commenced by flowing cleaning fluid into the cleaning basin 215. While the cleaning fluid is in the cleaning basin 215, the transducer 216 is cycled on/off to agitate the cleaning fluid. The cleaning fluid may be purged from the cleaning basin 215 by flowing DI water into the tank. Nitrogen gas may also be used during the purge process. In one embodiment, the cleaning/purge cycle is repeated sixteen times or until the showerhead has achieved a desired cleanliness.

Figure 4:
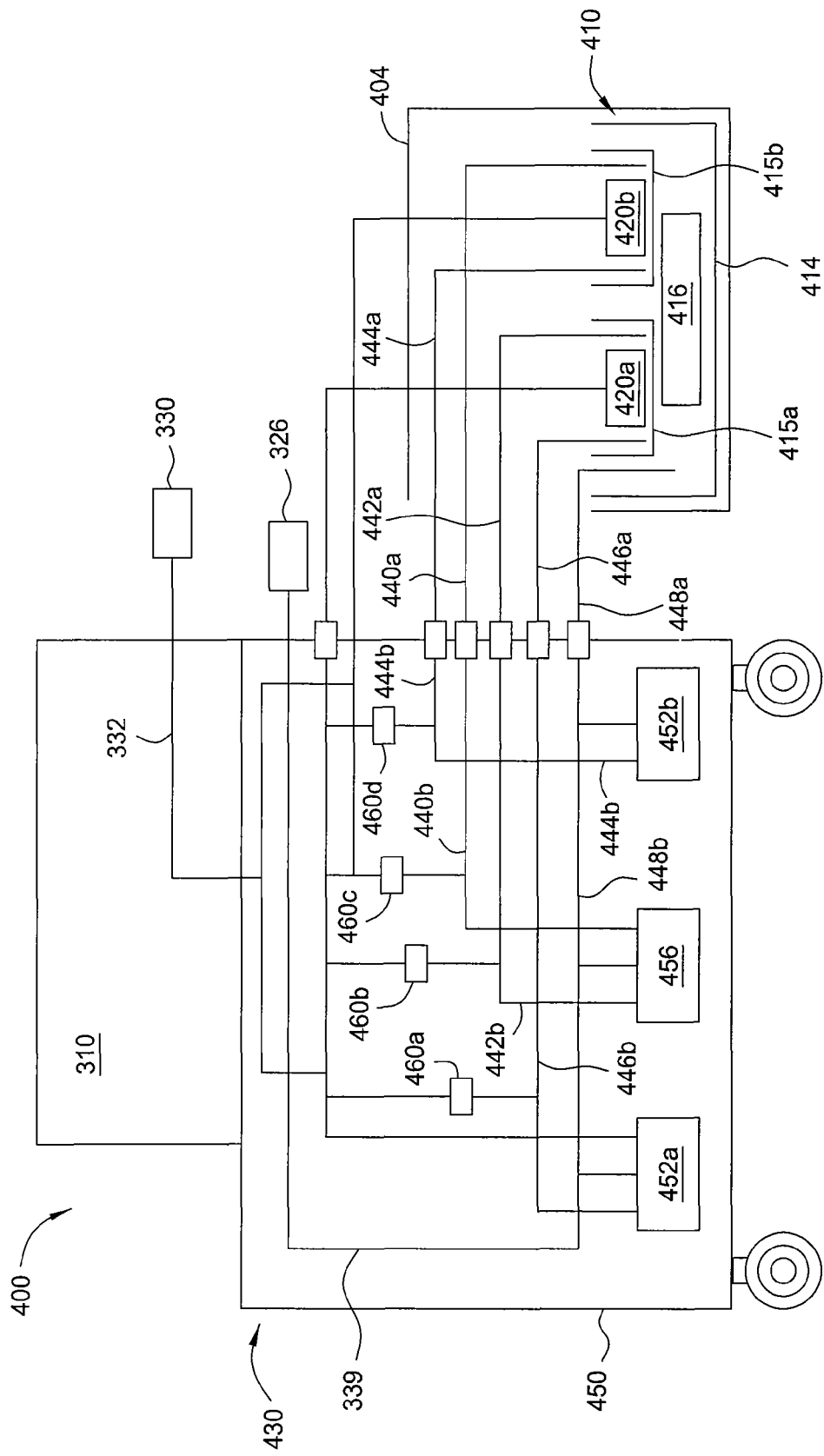
FIG. 4 is a schematic side view of another embodiment of a cleaning system according to embodiments described herein.

FIG. 4 is a schematic side view of another embodiment of a cleaning system 400 according to embodiments described herein. The cleaning system 400 is similar to the cleaning system 100 except that the cleaning system 400 is adapted to simultaneously or sequentially clean multiple component parts in different cleaning basins. The cleaning system 400 also has the capability to supply different cleaning chemistries to each cleaning basin. In one embodiment, this is achieved by duplicating the fluid delivery system in the cleaning fluid supply module 320. Additional cleaning fluid supply modules may be added to the cleaning fluid supply module to supply cleaning fluids to the additional cleaning basins. The additional hardware may be set-up in the same configuration as the hardware depicted in FIG. 3 however; the additional cleaning fluid delivery systems are generally in parallel with the initial fluid delivery system of the cleaning fluid supply module 320. With this configuration, different cleaning chemistries may be supplied to any one or more of the cleaning basins of the cleaning system 400.

In one embodiment, the cleaning system 400 comprises a wet bench set-up 404 similar to wet bench set-up 200 which comprises a cleaning vessel assembly 410 similar to cleaning vessel assembly 210 for holding multiple component parts 420a, 420b to be cleaned during the cleaning process and a detachable cleaning cart 430 for supplying the selected cleaning chemistry to the cleaning vessel assembly 410 during the cleaning process. The detachable cleaning cart 430 is movable and may be detachably coupled with the cleaning vessel assembly 410 prior to and during the cleaning process and may be removed from the cleaning vessel assembly 410 when cleaning is not taking place. Thus the detachable cleaning cart 430 may be used to service different cleaning vessels at different locations.

The cleaning vessel assembly 410 comprises an outer cleaning basin 414 similar to the outer cleaning basin 214, a transducer 416 similar to transducer 216 positioned within the outer cleaning basin 414, and a first cleaning basin 415a and a second cleaning basin 415b positioned within the outer cleaning basin 414 for supporting a first component part 420a and a second component part 420b to be cleaned in each respective cleaning basin 415a, 415b.

The wet bench set-up 404 also comprises fluid delivery lines 440a, 442a, 444a, 446a, and 448a for delivering cleaning fluids to the cleaning vessel assembly 410 and returning used cleaning fluids to the detachable cleaning cart 400 for recycling and reuse. The fluid delivery lines are configured to mate with corresponding fluid delivery lines 440b, 442b, 444b, 446b, and 448b on the detachable cleaning cart 430 using, for example, connect fittings and disconnect couplings. The fluid delivery lines 440a, 442a, 444a, 446a, 448a, 440b, 442b, 444b, 446b, and 448b are similar to the aforementioned fluid delivery lines 382a, 384, 386a, 388a, 382b, 386b, and 388b. Although five fluid delivery lines are depicted any number of fluid delivery lines may be used.

The detachable cleaning cart 430 comprises a system controller 310 for controlling the cleaning process and a cleaning fluid supply module 450 for supplying cleaning fluid to the cleaning vessel assembly 410 and recycling used cleaning fluid delivered from the cleaning vessel assembly 410. The cleaning fluid supply module 450 is similar to cleaning fluid supply module 320.

The cleaning fluid supply module 450 comprises a first cleaning fluid supply tank 452a for supplying cleaning fluid to the first cleaning basin 415a and a second cleaning fluid supply tank 452b for supplying cleaning fluid to the second cleaning basin 415b. The cleaning fluid in each cleaning fluid supply tank 452a, 452b may comprise deionized water (DIW), one or more solvents, a cleaning chemistry such as standard clean 1 (SC-1), selective deposition removal reagent (SDR), surfactants, acids, bases, or any other chemical useful for removing contaminants and/or particulates from a component part. In certain embodiments, different cleaning fluids may be simultaneously supplied to each of the cleaning basins 415a, 415b. In certain embodiments, the same cleaning fluid may be simultaneously supplied to each of the cleaning basins 415a, 415b.

The cleaning fluid supply module 450 may further comprise a heated DI water supply tank 456 for supplying heated DI water to each of the first cleaning basin 415a and the second cleaning basin 415b. The cleaning fluid supply module 450 further comprises pumps 460a, 460b, 460c, and 460d for controlling the flow of the various cleaning fluids which may be monitored by the system controller 310.

It should be understood that the cleaning system 100 and the cleaning system 400 may further comprise pressure regulators, pressure transducers, pressure indicators, valves, pumps and supply lines which are not described in detail for the sake of brevity.

Multiple cleaning chemistry capability for a single cleaning platform has several advantages in the area of semiconductor processing and other processing areas where cleanliness is desirable. For example, the ability to simultaneously provide different chemistries using a single detachable cleaning cart allows for the simultaneous cleaning of component parts comprising different materials. The portability of the detachable cleaning cart provides the capability to service different cleaning vessels at different locations using a single detachable cleaning cart. The ability to process multiple component parts simultaneously leads to a decrease in chamber downtime and a corresponding decrease in the cost of ownership.

While the foregoing is directed to embodiments of the present invention, other and further embodiments of the invention may be devised without departing from the basic scope thereof, and the scope thereof is determined by the claims that follow.

The invention claimed is:

1. A method for cleaning component parts in a cleaning chemistry comprising:
   providing a cleaning vessel assembly for holding one or more component parts to be cleaned during a cleaning process, comprising:
     an outer cleaning basin;
     a first cleaning basin circumscribed by the outer cleaning basin;
     a second cleaning basin circumscribed by the outer cleaning basin; and
       a transducer positioned within the outer cleaning basin below the first cleaning basin and the second cleaning basin;
   providing a detachable cleaning cart detachably coupled with the cleaning vessel for supplying one or more cleaning chemistries to the cleaning vessel assembly during the cleaning process, comprising:
     an inert gas module for supplying an inert gas which may be used as a purge gas during the cleaning process;
     a deionized (DI) water supply module;
     a first cleaning fluid supply tank for the first cleaning basin; and
     a second cleaning fluid supply tank for the second cleaning basin;
   positioning a first component part in the first cleaning basin;
   positioning a second component part in the second cleaning basin;
   flowing a first cleaning fluid from the first cleaning fluid supply tank into the first cleaning basin;
   flowing a second cleaning fluid from the second cleaning fluid supply tank into the second cleaning basin;
   cycling the transducer on and off to agitate the first cleaning fluid and the second cleaning fluid; and
   flowing DI water from the DI water supply module into the first cleaning basin and the second cleaning basin to purge the first cleaning fluid from the first cleaning basin and the second cleaning fluid from the second cleaning basin.

2. The method of claim 1, wherein flowing a first cleaning fluid from the first cleaning fluid supply tank into the first cleaning basin and flowing a second cleaning fluid from the second cleaning fluid supply tank into the second cleaning basin occur simultaneously.

3. The method of claim 1, wherein flowing a first cleaning fluid from the first cleaning fluid supply tank into the first cleaning basin and flowing a second cleaning fluid from the second cleaning fluid supply tank into the second cleaning basin occur sequentially.

4. The method of claim 1, wherein the first cleaning fluid and the second cleaning fluid are different chemistries.

5. The method of claim 1, further comprising:
   detaching the cleaning cart from the cleaning vessel;
   moving the cleaning cart to a second cleaning vessel assembly; and attaching the cleaning cart to the second cleaning vessel assembly.

* * * * *